(12) United States Patent
Erhardt et al.

(10) Patent No.: US 7,197,435 B1
(45) Date of Patent: Mar. 27, 2007

(54) METHOD AND APPARATUS FOR USING CLUSTERING METHOD TO ANALYZE SEMICONDUCTOR DEVICES

(75) Inventors: Jeffrey P. Erhardt, San Jose, CA (US); Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 281 days.

(21) Appl. No.: 10/817,300

(22) Filed: Apr. 2, 2004

(51) Int. Cl.
*G06F 15/00* (2006.01)

(52) U.S. Cl. .................... 702/189; 382/145; 702/179

(58) Field of Classification Search ........ 702/179–182; 382/145
See application file for complete search history.

(56) References Cited

U.S. PATENT DOCUMENTS

| 5,982,920 | A | * | 11/1999 | Tobin et al. | ................ | 382/145 |
| 6,397,166 | B1 | * | 5/2002 | Leung et al. | ............... | 702/179 |
| 2002/0145430 | A1 | * | 10/2002 | Arai et al. | .................. | 324/426 |

* cited by examiner

*Primary Examiner*—John Barlow
*Assistant Examiner*—Sujoy Kundu
(74) *Attorney, Agent, or Firm*—Mikio Ishimaru

(57) ABSTRACT

A method for analyzing a semiconductor device tests a semiconductor device to produce first and second data. A clustering method is applied to the first data, creating a clustered first data. The clustered first data is then correlated with the second data to determine analyzed data.

16 Claims, 3 Drawing Sheets

METHOD AND APPARATUS FOR USING CLUSTERING METHOD TO ANALYZE SEMICONDUCTOR DEVICES

BACKGROUND

1. Technical Field

The present invention relates generally to semiconductor technology and more specifically to semiconductor research, development, and production management.

2. Background Art

Electronic products are used in almost every aspect of life, and the heart of these electronic products is the integrated circuit. Integrated circuits are used a wide variety of products, such as televisions, telephones, and appliances.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not an acceptable solution for major problems. For example, during the production of semiconductor devices, in-line defect inspections are conducted to obtain defect data about the devices. In-line defects are detected by inspection techniques conducted between process steps for fabricating the semiconductor devices. (Actual defects are determined later using electrical tests after the chip fabrication is completed.) The defect data is typically collected by laser scanning, optical, or scanning electron microscope ("SEM"). Defects may include a plurality of different events that may have very different respective impacts on chip yield. Any irregularities such as structural imperfections, particles, residuals, or embedded foreign material are considered as defects.

The inspection techniques often result in a total count of the number of defects detected in each process step, but not an abundance of in-depth or specific defect data. Total count information alone is not adequate for assigning good yield loss projections to defects detected at each particular process step.

It is common practice in the semiconductor industry, however, to inspect wafers at various times by employing inspection tools during production. The better the inspections, the better the data that can potentially shorten yield learning cycles by making it possible to react quickly to process problems. The process engineer therefore needs to know the number of defects per wafer, the x-y coordinates of each defect, and a set of parameters (different for different tools) specific for each particular defect. To obtain yield impact projections, it is then desirable to correlate the actual defect data to actual electrical failures. Such data can be crucial for maximizing yields of a product.

Speed is also critical for efficient manufacturing. Reviewing all the inspected defects, even using known automated classification, can significantly delay yield learning cycles and the subsequent manufacturing process for the semiconductor devices.

Therefore, a need exists for a method and system for quickly correlating large amounts of in-line defect data in each defect-inspected wafer with location and known defect and yield data in order to suggest corresponding process anomalies associated with such defects so that appropriate process adjustments and corrections can be made.

Solutions to these problems have been long sought but prior developments have not taught or suggested any solutions and, thus, solutions to these problems have long eluded those skilled in the art.

DISCLOSURE OF THE INVENTION

The present invention provides a method for analyzing semiconductor device. A semiconductor is tested to produce first and second data. A clustering method is applied to the first data, creating a clustered first data. The clustered first data is then correlated with the second data to determine analyzed data. This process allows for the handling of large amounts of semiconductor testing information and reduces the complexity and time required for testing.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
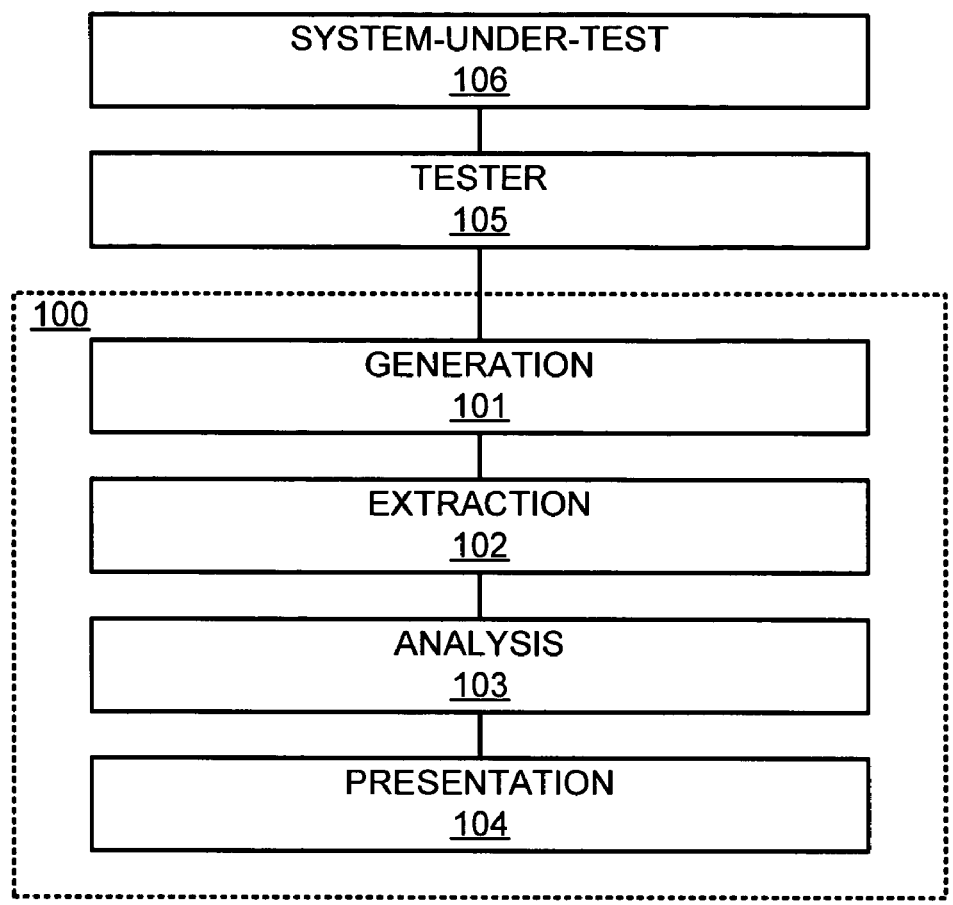
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, circuitry, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, which operate on and manipulate information and/or data, which are generically defined herein as "information". The tester information processing system 100 receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, conventional test information, a personal computer, etc. It has been discovered that it is possible to program the tester 105 to automatically collect current versus voltage or threshold voltage distribution for all die on a wafer. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different interrelationships.

For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. In some cases, this can include mapping, commonality, or correlation of the test data to physical locations in the system-under-test 106. Unlike previous systems where a few experiments were performed and/or a relatively few data points were determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

In the production of semiconductor devices, each process step must be developed and stabilized as quickly as possible. It is therefore essential to perform failure analysis rapidly, efficiently, and effectively, so that the results of the failure analysis can facilitate quick repair of the process defect that caused the failure.

Figure 2:
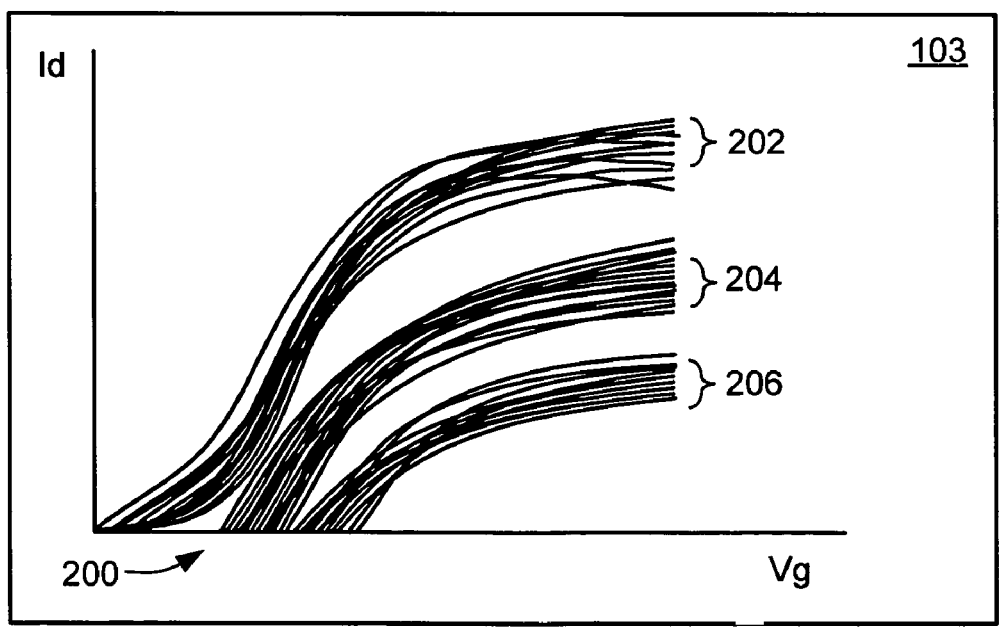
FIG. 2 shows a graph of IV curves representing data generated in the generation block.

Referring now to FIG. 2, therein is shown a graph of current-voltage (IV) curves 200. These curves are representative of the raw test data that can be generated in the generation block 101, and are one form the usable information received by the analysis block 103 might take. The test data can have clusters of similar IV curves such as clusters A 202, B 204, and C 206. As this test data can be generated automatically, massive amounts of data can be generated for a single system under test 106.

Figure 3:
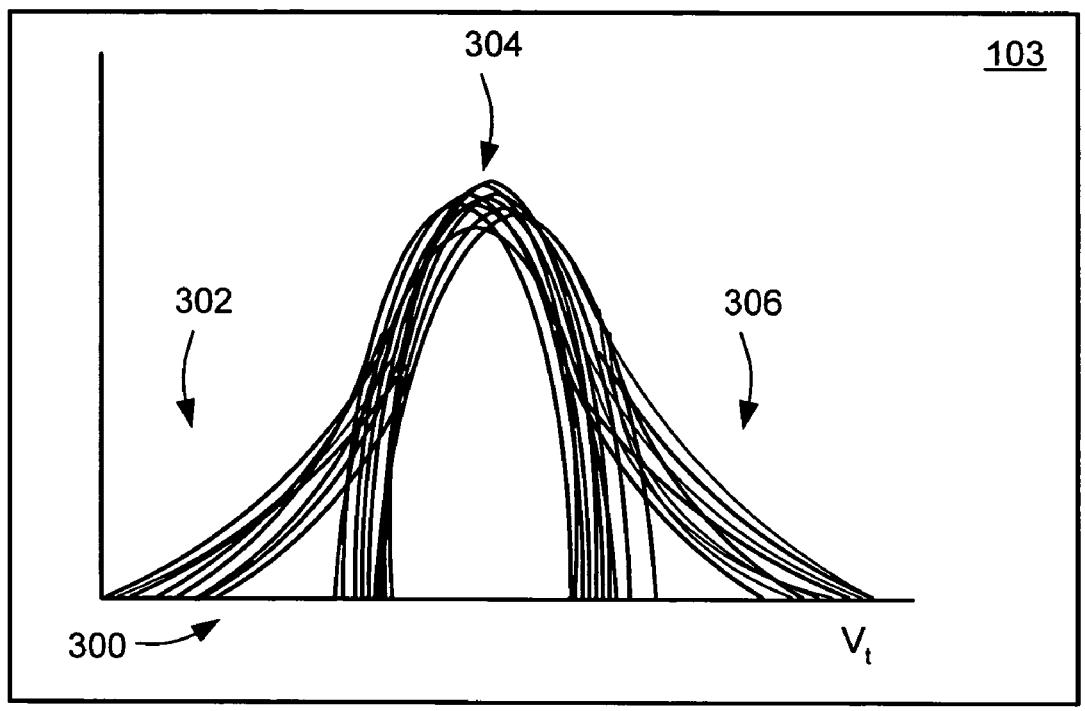
FIG. 3 shows a graph of $V_t$ distributions representing data generated in the generation block.

Referring now to FIG. 3, therein is shown a graph of threshold voltage ($V_t$) distributions 300. These distributions are representative of the raw test data that can be generated in the generation block 101, and are another form the usable information received by the analysis block 103 might take. The test data can have clusters of similar $V_t$ distributions such as clusters D 302, E 304, and F 306. As this test data can be generated automatically, massive amounts of data can be generated for a single system-under-test 106.

Figure 4:
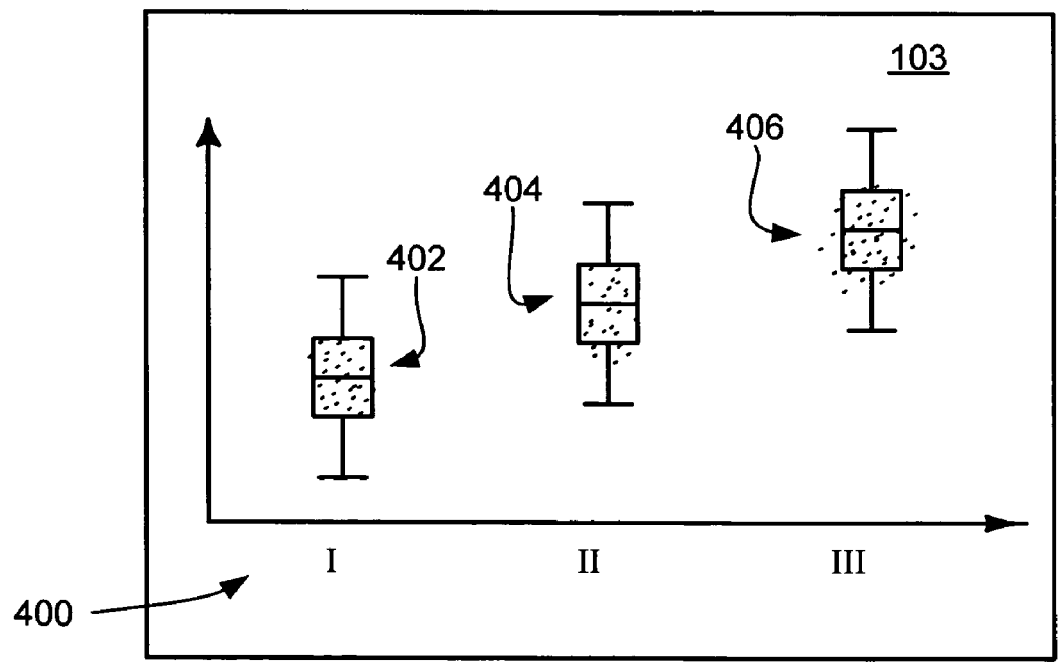
FIG. 4 is a box chart after the application of a clustering method.

Referring now to FIG. 4, therein is shown a box chart 400 after the application of a clustering method to the usable information received by the analysis block 103. The application of a clustering method occurs in the analysis block 103 and makes utilizing the vast amounts of data more manageable. The box chart 400 is an example of a possible result of the clustering method including boxes G 402, H 404, and I 406, which represent ranges of clustered, data with similar characteristics such as the clusters A 202, B 204, and C 206 in FIG. 2, or D 302, E 304, and F 306 in FIG. 3. These boxes could be viewed as three separate regions on the system-under-test 106 which have been exposed to three slightly different processes, or process-splits.

The clustering method can be K-means clustering or Spatial Signature Analysis (SSA). K-means clustering is a nonhierarchical clustering method, which repeatedly examines data to create and refine clusters in order to maximize the significance of intergroup distance. K-means clustering can be used to create a classification that can be used for subsequent analysis such as wafer mapping, commonality, and correlation. SSA has been developed only to analyze group and wafer patterns. Treating the data, such as the IV curves 200 and the $V_t$ distributions 300, as a "wafer", SSA can be used to allow subsequent analysis such as wafer mapping, commonality, and correlation.

Figure 5:
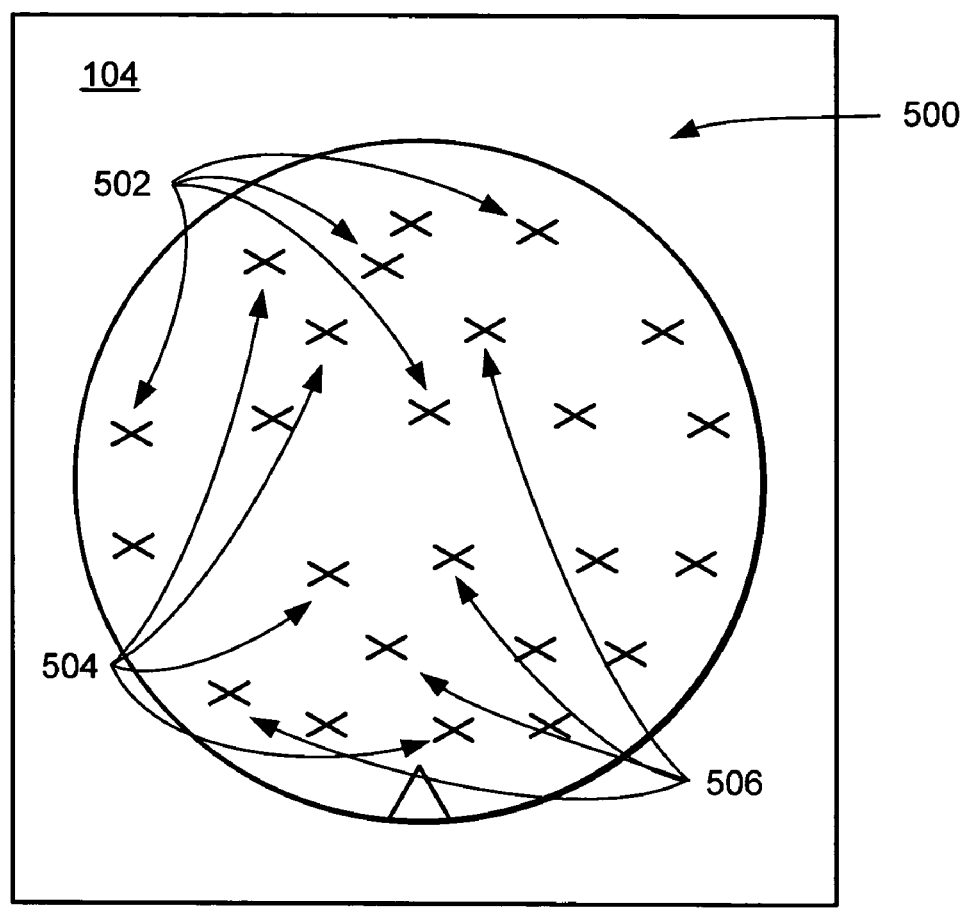
FIG. 5 is a presentation block showing correlated data.

Referring now to FIG. 5, therein is shown a presentation block 104 wherein data from the analysis block 103 has been correlated with the corresponding areas of the system-under-test 106, in this case a semiconductor wafer, to make a wafer map 500 with the analyzed data. Areas G 502, H 504, and I 506 are areas with characteristics similar to the clusters of data in boxes G 402, H 404, and I 406 in FIG. 4. While the characteristics of some areas might indicate defects, characteristics of other areas might indicate areas with desired behavior.

While the depictions in FIGS. 2, 3, 4, and 5 are depicted generally as clearly defined, it will be understood that the variety of characteristics in practice is as diverse as the production and process defects that lead to giving wafer die their complex characteristics and defects. As an example, asymmetrical defect clustering (not shown) toward one side of a wafer might indicate an uneven exposure to etchant. Such uneven exposure to etchant might occur when a wafer is immersed into an etchant in a manner that exposes one side of the wafer to the etchant noticeably longer than the opposite side.

A method according to the present invention thus analyzes semiconductor test data, such as wafer defect data. This analyzed data can then be correlated with physical data to identify defect areas, predict the causes, and suggest solutions. Yield learning cycles are therefore accelerated by the present invention, defect causes are more quickly identified, and corrective yield impact projections are promptly and accurately generated. The corresponding manufacturing process problems are then corrected and optimized more quickly, and process yields are correspondingly improved more rapidly.

It will be readily understood, based upon this disclosure, that the same methodology and equipment of the present invention may also be used to analyze other semiconductor test data types that are currently treated as collections of individual data points in addition to $V_t$ distributions and IV curves.

It will also be readily understood, based upon this disclosure, that other forms of cluster analysis in addition to K-means clustering and SSA may be used to analyze semiconductor test data. The result is much faster and more accurate analyses that advantageously avoid current limitations such as manual classification, intensive computation, and so forth.

Figure 6:
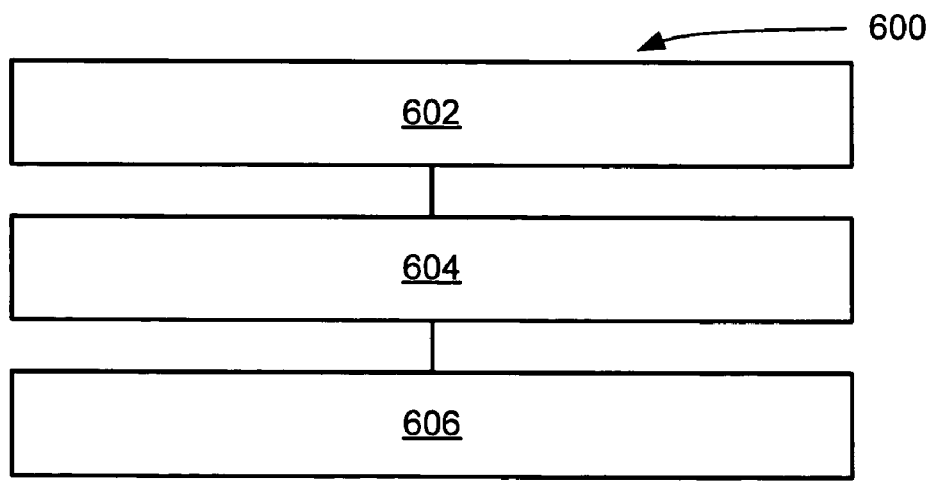
FIG. 6 is a system for carrying out an embodiment of the present invention.

Referring now to FIG. 6, therein is shown a system 600 in accordance with an embodiment of the present invention in which the blocks are steps in a method or circuitry for carrying out the steps. The system 600 includes: testing a semiconductor device to produce first data and second data in a block 602; applying a clustering method to the first data to create a clustered first data in a block 604; and correlating the clustered first data with the second data to determine analyzed data in a block 606.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for analyzing a semiconductor device comprising:
    testing a semiconductor device to produce first data and second data wherein the first data is selected from a group consisting of IV curves and $V_t$ distributions;
    applying a clustering method to the first data to create a clustered first data;
    correlating the clustered first data with the second data to determined analyzed data; and
    presenting the analyzed data for yield review.

2. The method of claim 1 wherein the clustering method is spatial signature analysis.

3. The method of claim 1 wherein the clustering method is K-means clustering.

4. The method of claim 1 wherein the analyzed data is selected from a group consisting of wafer mapping, commonality, or correlation.

5. A method for analyzing a semiconductor device comprising:
    testing a semiconductor device to produce physical data and electrical data wherein the produced data is selected from a group consisting of IV curves and $V_t$ distributions;
    applying a clustering method to the electrical data to create clustered electrical data and correlating the clustered electrical data with the physical data to determine analyzed data; and
    presenting the analyzed data for yield review.

6. The method of claim 5 wherein the clustering method is spatial signature analysis.

7. The method of claim 5 wherein the clustering method is K-means clustering.

8. The method of claim 5 wherein the analyzed data is selected from a group consisting of wafer mapping, commonality, or correlation.

9. Apparatus for analyzing a semiconductor device, comprising:
    circuitry for testing a semiconductor device, to produce first data and second data wherein the first data is selected from a group consisting of IV curves and $V_t$ distributions;
    circuitry for applying a clustering method to the first data to create a clustered first data; and
    circuitry for correlating the clustered first data with the second data to determine analyzed data.

10. The apparatus of claim 9 wherein the clustering method is spatial signature analysis.

11. The apparatus of claim 9 wherein the clustering method is K-means clustering.

12. The apparatus of claim 9 wherein the analyzed data is selected from a group consisting of wafer mapping, commonality, or correlation.

13. Apparatus for analyzing a semiconductor device, comprising:

circuitry for testing a semiconductor device to produce physical data and electrical data wherein the produced data is selected from a group consisting of IV curves and $V_t$ distributions:

circuitry for applying a clustering method to the electrical data to create clustered electrical data; and circuitry for correlating the clustered electrical data with the physical data to determine analyzed data.

14. The apparatus of claim 13 wherein the clustering method is spatial signature analysis.

15. The apparatus of claim 13 wherein the clustering method is K-means clustering.

16. The apparatus of claim 13 wherein the analyzed data is selected from a group consisting of wafer mapping, commonality, or correlation.

\* \* \* \* \*